United States Patent [19]

Pelletier et al.

[11] 4,439,695
[45] Mar. 27, 1984

[54] INTERFACE CIRCUITS BETWEEN INJECTION-LOGIC LAYERS WHICH ARE SUPERIMPOSED AND BIASSED WITH DIFFERENT VOLTAGES

[75] Inventors: Joël A. Pelletier, Les Essarts le Roi; Robert Breuillard, Deuil la Barre, both of France

[73] Assignee: U.S. Philips Corporation, New York, N.Y.

[21] Appl. No.: 303,266

[22] Filed: Sep. 17, 1981

[30] Foreign Application Priority Data

Sep. 26, 1980 [FR] France ................. 80 20698

[51] Int. Cl.³ ................. H03K 19/092; H03K 19/091
[52] U.S. Cl. ..................... 307/477; 307/459; 307/475
[58] Field of Search ............. 307/443, 459, 477, 250, 307/299 B, 300, 475; 357/92

[56] References Cited

U.S. PATENT DOCUMENTS

| | | | |
|---|---|---|---|
| 4,013,901 | 3/1977 | Williams | 307/477 X |
| 4,109,162 | 8/1978 | Heuser et al. | 357/92 X |
| 4,137,465 | 1/1979 | Hart | 307/477 |
| 4,243,896 | 1/1981 | Chapron | 359/92 X |
| 4,256,984 | 3/1981 | Kojima | 307/475 X |
| 4,326,135 | 4/1982 | Jarrett et al. | 307/477 X |

Primary Examiner—John S. Heyman
Assistant Examiner—David R. Hudspeth
Attorney, Agent, or Firm—Thomas A. Briody; Jack E. Haken; James J. Cannon, Jr.

[57] ABSTRACT

For transferring a logic signal between a first stage and a second stage at higher level in an integrated current injection logic circuit formed by superimposed layers which are biassed with different voltages (for example an I²L logic circuit), the collector of a first transistor at the output of the first stage controls the base of a first auxiliary transistor, whose collector is connected to the base of a second transistor, which provides the connection to the input of the second stage. In order to rapidly drain the charge stored in the base of the second transistor, said base is connected to the base of a third transistor, whose collector is connected to its base so as to form a current mirror. The switching time of the device in accordance with the invention is thus substantially reduced. Moreover, said device has the special feature that the logic levels are situated on both sides of a reference voltage applied to the base of a second auxiliary transistor, which enables it to be used as an interface between different types of logic circuits.

5 Claims, 4 Drawing Figures

INTERFACE CIRCUITS BETWEEN INJECTION-LOGIC LAYERS WHICH ARE SUPERIMPOSED AND BIASSED WITH DIFFERENT VOLTAGES

BACKGROUND OF THE INVENTION

1. Field of the Invention

The invention relates to an integrated current-injection logic circuit comprising transistors whose bases are connected to current injectors and to a collector of at least one further transistor, said integrated circuit being formed by a plurality of elementary cells which are arranged in series across a power supply, in such a way that the cells form superimposed stages between which the supply voltage is distributed, a first stage and a second stage at a lower level being logically interconnected by means of an interface device in which the collector of a first transistor, which supplies the signal, controls a first auxiliary transistor whose conductivity type is opposite to that of said first transistor and whose collector is connected to that base of a second transistor in the second stage which is not connected to a current injector.

2. Description of the Prior Art

In the literature one type of injection logic is known by the name of I²L circuit (see for example French Pat. No. 2,244,262). It has the double advantage of a low power dissipation (smaller than 1 p J/gate) and a high integration density which approximates that of MOS (several hundreds of gates per mm²), thus permitting its use in LSI and VLSI logic circuits. However, the interface device mentioned in the opening paragraph has the disadvantage that it has a very low switching speed. When the current injected into the base of the second transistor by the auxiliary transistor is interrupted, the second transistor switches from the saturated state (0.1 volt between collector and emitter, which corresponds to logic 0) to the cutoff state (0.7 volt between the collector and emitter, which is equivalent to logic 1). However, this switching operation is delayed by the slow elimination through recombination of charges stored in the base zone of the second transistor. French Patent Specification Nos. 2,323,234 and 2,354,634 describe substantially identical interface devices, whose operation is based on the principle of rapidly draining said stored charges via a third transistor, which is controlled by a second auxiliary transistor which is of the same conductivity type as the first one and which conducts when the first one is cut off. However, for controlling such devices an additional fourth transistor and two current injectors are required.

SUMMARY OF THE INVENTION

It is the object of the invention to provide a different interface device which also improves the switching time, but which is more flexible to use because the logic states are defined relative to a reference voltage, and whose control circuit dispenses with the fourth transistor and one current injector. The device in accordance with the invention is characterized in that the collector of said first auxiliary transistor constitutes the input terminal of a current mirror, whose output terminal is constituted by the collector of said second transistor, the emitter of said first auxiliary transistor being connected to the emitter of a second auxiliary transistor of the same conductivity type and situated in the same stage as the first one, whose base is at a reference voltage and whose collector is connected to ground.

There are numerous types of current mirror whose complexity increases with the degree of accuracy required for the current value and which can be adapted to be suitable for use in the device in accordance with the invention; for example the current mirror which is obtained in one of the simplest ways by connecting the base of the second transistor of the second stage to that base of the a third transistor which is not connected to a current injector, which third transistor is of the same conductivity type, is situated in the same stage, and has its collector connected to its base.

The auxiliary transistors are controlled by connecting the base of the first auxiliary transistor to the collector of the first transistor and to a current injector and by connecting the point which is common to the emitters of the auxiliary transistors to a further current injector situated in a higher stage. Since the fourth transistor and its current injector are dispensed with, this eliminates one switching operation in order to transfer the signal.

The prior-art interface devices may be used for the transfer of logic signals between stages of I²L logic circuits only. In the device in accordance with the invention the logic levels are situated on both sides of a reference voltage, which provides greater flexibility of use, so that an injection logic circuit may be connected to other types of logic, such as TTL, CMOS etc. For this it suffices to adjust the value of the reference voltage to an appropriate level.

BRIEF DESCRIPTION OF THE DRAWINGS

The following description with reference to the accompanying drawings, given by way of example, enables the invention to be more fully understood.

DESCRIPTION OF THE PREFERRED EMBODIMENT

Figure 1:
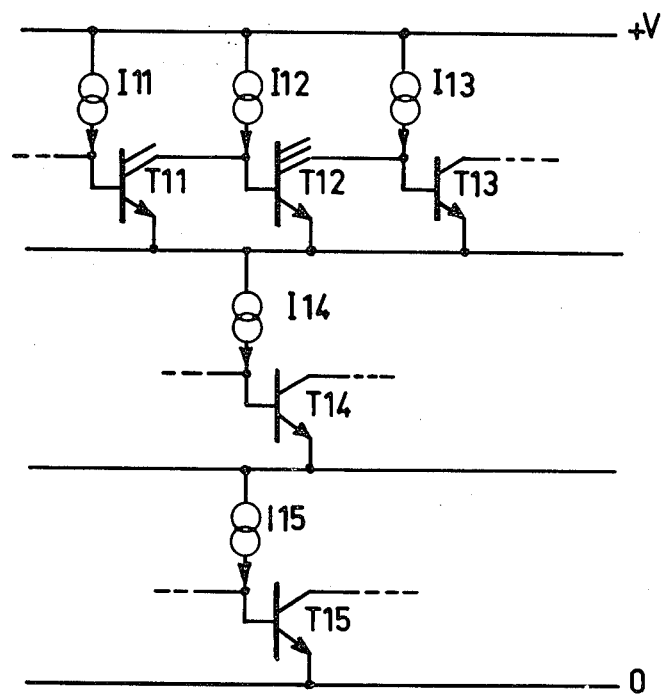
FIG. 1 schematically represents a circuit of the I²L type comprising a plurality of stages.

In FIG. 1 a plurality of stages of an I²L circuit are arranged in series for an optimum use of the supply voltage. Each stage thus operates at the supply voltage of an I²L gate which is equal to the emitter-base bias of the current injector, that is approximately 0.8 volts. In the upper stage, which is at the positive voltage +V, three I²L gates connected in parallel are schematically represented by the transistors $T_{11}$, $T_{12}$ and $T_{13}$ having one or a plurality of collector outputs and by the current injectors represented by the current sources $I_{11}$, $I_{12}$ and $I_{13}$. The lower stages are schematically represented by the transistors $T_{14}$ and $T_{15}$ and by the current injectors represented by the current sources $I_{14}$ and $I_{15}$. The base of transistor $T_{12}$ of the upper stage is connected to the current injector $I_{12}$ and to a collector of transistor $T_{11}$. Similarly, the base of the transistor $T_{13}$ is connected to the current injector $I_{13}$ and to a collector of the transistor $T_{12}$ etc. The transfer of a logic signal between I²L gates of one stage and from I²L gates of one stage to those of another stage at a higher level takes place without special steps and presents no problem. However, providing a logic connection from I²L gates of a first stage and to those of a second, lower stage presents more difficulties, as will be described with reference to FIG. 2. In said Figure two stages of the circuit are arranged in series between the power-supply terminal 1, 2 and 3. In the first stage, between the terminal 1 and 2, the I²L output gate of the stage is constituted by the NPN transistor 10 and the current source 20. The emitter of transistor 10 is at the potential of the terminal 2 and its base is connected to terminal 1 via the current source 20; the logic signal to be transferred is available on its collector. In the second stage between the terminal 2 and 3, the I²L input gate, constituted by the NPN transistor 11 and the current source 21, the logic signal, supplied by the first stage via the interface device, is applied to the base of transistor 11, which is connected to the terminal 2 via the current source 21, the emitter of the transistor 11 being at the potential of terminal 3, which is connected to ground. In order to provide a functional logic connection between the output of the first stage and the input of the second stage, the collector of transistor 10 is connected to the base of the auxiliary PNP-type transistor 12 in the first stage and to the terminal 1 via the current source 22, the collector of the auxiliary transistor 12 being connected to the base, which is not connected to a current source, of the NPN transistor 13 in the second stage, whose emitter and collector are respectively connected to the emitter and to the base of transistor 11.

In order to explain the operation of the part of the device described in the foregoing, it is assumed that the auxiliary transistor 12 can be turned on or off by means of an auxiliary circuit which will be described hereinafter. If the auxiliary transistor 12 is turned on when a logic 0 appears on the output of the first stage (transistor 10 bottomed), the collector current of the auxiliary transistor 12 is transferred to the base of the transistor 13 via the connection P, thereby rapidly turning on said transistor, so that a logic 0 appears on the input of the second stage (transistor 13 bottomed). Thus, the logic 0 is transferred from the output of the first stage to the input of the second stage without any appreciable delay. If now the auxiliary transistor 12 is turned off when the logic 1 appears on the output of the first stage (transistor 10 cut off), no current can flow to the base and to the collector of transistor 13. As a result of this, the last-mentioned transistor is turned off and the logic 1 will appear on the input of the I²L gate of the second stage. However, the transfer of the logic 1 is delayed because in the collector of the transistor 13 a current is sustained by the slow elimination, through recombination, of minority carriers which constitute the charge stored in the base of said transistor during the previous logic state. The propagation delay also depends on the technology used for the auxiliary transistor 12 of the laternal PNP type. It is known that for this type of transistor the minority carriers, constituted by holes whose mobility carriers, constituted by holes whose mobility is low, pass through very thick base layers which substantially prolongs the switching time. Furthermore, the stray capacitance of the emitter-base junction of the transistor 13 gives rise to an additional time constant.

Figure 3:
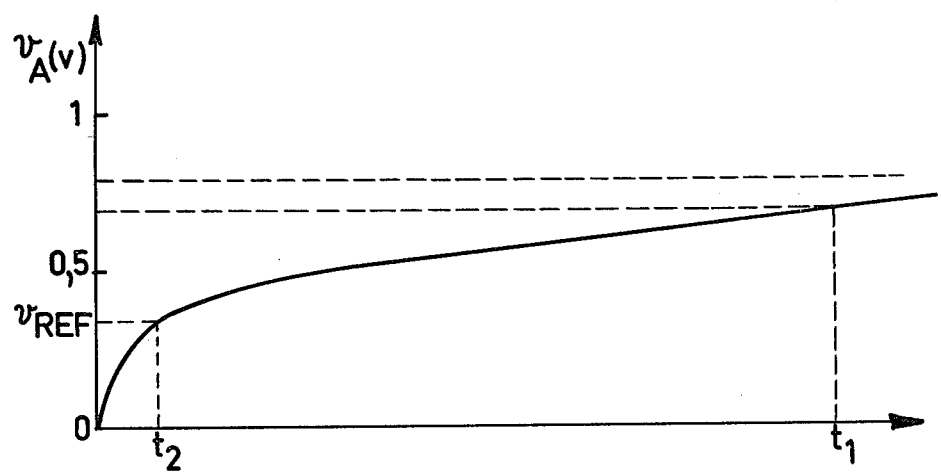
FIG. 3 shows how the output voltage of the first stage varies between two logic states as a function of time.

This effect is illustrated by FIG. 3, which represents the variation of the potential difference $V_A$ between the potential $V_A$ on the base of the auxiliary transistor 12 and the potential on the terminal 2 (output of the first stage) as a function of time. $V_A$ approximates to a limit value with a high time constant, which limit value is the bias voltage of the base-emitter diode, or 0.8 V, and the switching time $t_1$ between logic 0 (0.1 V) and logic 1 (0.7 V) is relatively great.

Figure 2:
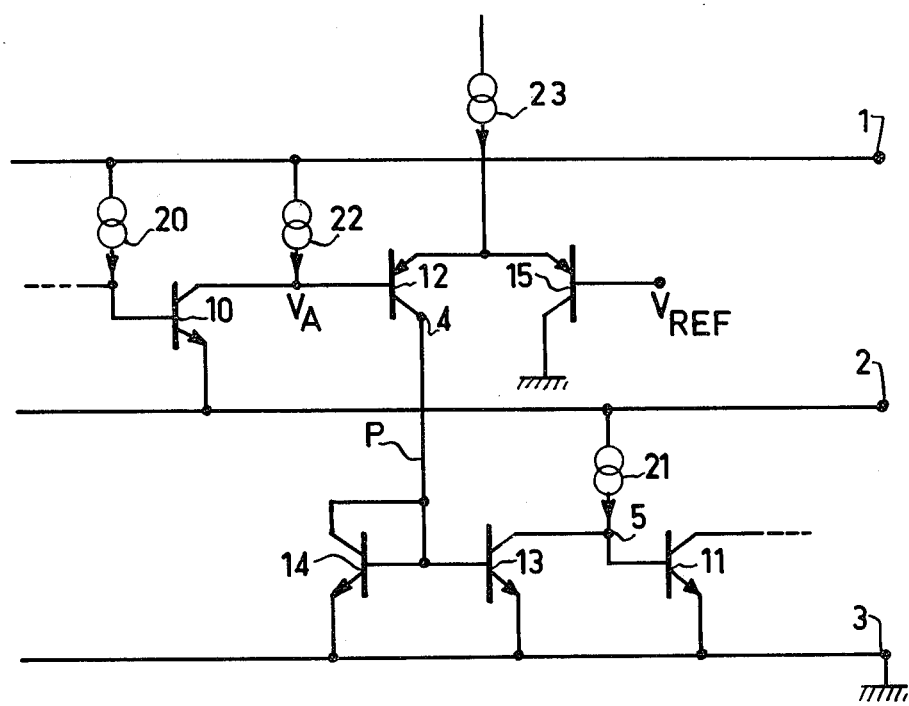
FIG. 2 is the circuit diagram fo the interface device by means of which the signal is transferred from the upper to the lower one of two stages of a I²L logic circuit in accordance with the invention.

This switching time is substantially reduced by the additional elements, which are also shown in FIG. 2 and will be described hereinafter. In said Figure the collector of the first auxiliary transistor 12 constitutes the input terminal 4 of a current mirror, whose output terminal 5 is constituted by the collector of the transistor 13. The emitter of the auxiliary transistor 12 is connected to the emitter of a further PNP-type transistor 15 in the first stage, whose base is at a reference voltage $V_{REF}$ and whose collector is connected to ground. The junction point of the emitters of the auxiliary transistors 12 and 15 is connected to the current source 23 of a higher stage. In order to form the current mirror the base of the transistor 13 is connected to the base, which is not connected to a current source, of a NPN-type transistor 14 in the second stage, whose collector is connected to its base and whose emitter is at the potential of terminal 3.

In the example of the first stage of the circuit which is schematically shown in FIG. 2, the epitaxial N zone of one island cannot simultaneously form the base of transistor 15, to which the reference voltage is applied, and the ground of the I²L logic gates. In order to overcome this problem, the two auxiliary transistors 12 and 15 must necessarily be arranged in two islands which are distinct from the remainder of the circuit.

In order to explain the operation of the complete device in accordance with the circuit diagram shown in FIG. 2, it is assumed that the potential $V_A$ on the output of the first stage is lower than the reference voltage $V_{REF}$. The auxiliary transistor 12 is then conductive, while the auxiliary transistor 15 is cut off. The current from the current source 23 is diverted to the auxiliary transistor 12. Thus, on the output of the first stage the equivalent of a logic 0 is obtained which, in accordance with the explanation given in the foregoing, is transferred to the input of the second stage without any appreciable delay. If subsequently $V_A$ becomes higher than $V_{REF}$, the auxiliary transistor 12 is cut off, while the auxiliary transistor 15 is turned on. The current from the current source 25 is drained to ground via transistor 15. Thus, the equivalent of a logic 1 is obtained on the output of the first stage, whose transfer to the second stage is still delayed by a current persisting in the collector of the transistor 13 during the recombination of charge stored in the base zone of said transistor, but whose delay is substantially reduced. Indeed, by means of the current mirror constituted by the transistors 13 and 14, the current in the collector of the transistor 13 also appears in the emitter of the transistor 14 and is thus rapidly drained to ground. If the value of the reference voltage is selected to be intermediate between the values of the potentials on the terminals 1 and 2 and if in the graph of FIG. 3 the potential difference $v_{REF}$ between $V_{REF}$ and the potential of terminal 2 is plotted, it is found that the new switching time $t_2$ is substantially smaller than $t_1$.

Figure 4:
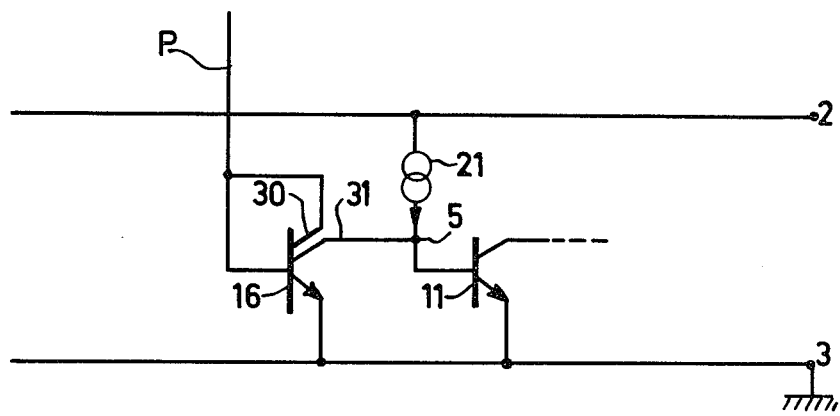
FIG. 4 illustrates a possibility of simplifying the current-mirror function by means of a simple I²L gate.

It is to be noted that the current mirror described in the foregoing and constituted by the transistors 13 and 14 necessitates the use of two islands diffused into the epitaxial N zone, which is a comparatively bulky arrangement, which is suitably replaced by a more simple arrangement which dispenses with the transistor 14. For this purpose it suffices to diffuse another N+collector in the P-type island constituting the base of the transistor 13, which is a particularly convenient solution in an I²L logic circuit, because a gate of such a circuit may comprise up to four collector outputs. The current mirror is then formed by connecting the input of one gate to the input of said current mirror and feeding back one of the outputs of said gate to its input, while a further output constitutes the output terminal of the current mirror. Said simplified device is shown by the diagram of FIG. 4. In this Figure only the second stage of the circuit is shown. The input terminal 4 of the current mirror is connected to the base of a NPN-type transistor 16 via the connection P, which transistor has two collector outputs 30 and 31 and has its emitter connected to ground. The collector 30 is connected to the base of transistor 16 and the collector 31, which constitutes the output terminal 5 of the current mirror, is connected to the base of the transistor 11.

What is claimed is:

1. An integrated current-injection logic circuit comprising transistors whose bases are connected to current injectors and to a collector of at least one further transistor, said integrated circuit being formed by a plurality of elementary cells which are arranged in series across a power supply, in such a way that the cells form superimposed stages between which the supply voltage is distributed, a first stage and a second stage at a lower level being logically interconnected by means of an interface device having a first transistor (10) whose emitter is connected to a reference voltage, its base to a current source and in which the collector of said first transistor, which supplies the signal at the output of the first stage, controls a first auxiliary transistor (12) in said first stage whose conductivity type is opposite to that of said first transistor and whose collector is connected to the base of a second transistor in the second stage, which is not connected to a current injector, characterized in that the collector of said first auxiliary transistor constitutes the input terminal of a current mirror, whose output terminal is constituted by the collector of said second transistor, the emitter of said first auxiliary transistor being connected to the emitter of a second auxiliary transistor of the same conductivity type and situated in the same stage of the first one, whose base is connected to a reference voltage supply and whose collector is connected to ground.

2. An integrated logic circuit as claimed in claim 1, characterized in that the current mirror is formed by connecting the base of said second transistor of the second stage to that base of a third transistor, which is not connected to a current injector, which third transistor is of the same conductivity type, is situated in the same stage, and has its collector connected to its base.

3. An integrated logic circuit as claimed in claim 1, characterized in that the current mirror is formed by connecting a further collector of said second transistor to its base.

4. An integrated logic circuit as claimed in any one of the claims 1 to 3, characterized in that the base of said first auxiliary transistor is connected to the collector of said first transistor and to a current injector, and that the point which is common to the emitters of said auxiliary transistors is connected to a further current injector situated in a higher stage.

5. An integrated logic circuit as claimed in any one of the claims 1 to 3, characterized in that the logic levels are situated on both sides of said reference voltage, said reference voltage being adjustable to enable the interconnection between an I²L logic circuit and other logic families.

* * * * *